(12) United States Patent
Kamitani

(10) Patent No.: US 6,876,935 B2
(45) Date of Patent: *Apr. 5, 2005

(54) METHOD FOR CORRECTING MEASUREMENT ERROR, METHOD OF DETERMINING QUALITY OF ELECTRONIC COMPONENT, AND DEVICE FOR MEASURING CHARACTERISTIC OF ELECTRONIC COMPONENT

(75) Inventor: Gaku Kamitani, Kyoto (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/601,718

(22) Filed: Jun. 23, 2003

(65) Prior Publication Data

US 2004/0059529 A1 Mar. 25, 2004

Related U.S. Application Data

(63) Continuation-in-part of application No. 10/306,760, filed on Nov. 27, 2002, now Pat. No. 6,697,749.

(30) Foreign Application Priority Data

Sep. 24, 2002 (JP) ........................................ 2002-277393
Jan. 20, 2003 (JP) ........................................ 2003-011164

(51) Int. Cl.⁷ ............................................. G01R 27/00
(52) U.S. Cl. .......................................................... 702/65

(58) Field of Search ............................. 702/57, 64, 65, 702/85, 90, 107, 182; 324/202, 601

(56) References Cited

U.S. PATENT DOCUMENTS

5,175,492 A * 12/1992 Wong et al. .................. 324/74
5,784,299 A *  7/1998 Evers et al. .................. 702/85
6,697,749 B2 *  2/2004 Kamitani ..................... 702/107

FOREIGN PATENT DOCUMENTS

JP          08-015348          1/1996

OTHER PUBLICATIONS

HP 4284A Precision LCR Meter Instruction Manual, pp. 6–14 to 6–19 (Dec. 1966).

* cited by examiner

Primary Examiner—Michael Nghiem
(74) Attorney, Agent, or Firm—Ostrolenk, Faber, Gerb & Soffen, LLP

(57) ABSTRACT

The impedance of a correction-data obtaining sample is measured by a standard measuring device and an actual measuring device so as to obtain an interrelated expression of the measurement results generated by the standard and actual measuring devices. The impedance of an electronic component measured by the actual measuring device is substituted into the interrelated expression and the expression is calculated. Accordingly, the impedance of the electronic component is corrected to the impedance which would be obtained from the standard measuring device.

7 Claims, 6 Drawing Sheets

METHOD FOR CORRECTING MEASUREMENT ERROR, METHOD OF DETERMINING QUALITY OF ELECTRONIC COMPONENT, AND DEVICE FOR MEASURING CHARACTERISTIC OF ELECTRONIC COMPONENT

CROSS REFERENCE TO RELATED APPLICATION

This is a continuation-in-part of Ser. No. 10/306,760 filed Nov. 27, 2002 now U.S. Pat. No. 6,697,749, the disclosure of which is incorporated by reference herein.

BACKGROUND OF THE INVENTION

1. Field of the Invention

The present invention relates to a method of correcting a measurement error, in which the impedance of an electronic component measured by an actual measuring device is corrected to the impedance which will be obtained when measurement is performed by using a standard measuring device. Also, the present invention relates to a method of determining the quality of an electronic component using the correction method, and a device for measuring the characteristic of an electronic component for performing the correction method.

2. Description of the Related Art

The impedance of an electronic component or the same type of electronic components may be measured by a plurality of measuring devices, for example, a measuring device of the manufacturer of the electronic component and that of a user.

In this case, a different measurement error occurs depending on the used measuring device. Therefore, the reproducibility of the measurement value is low, that is, when an electronic component is measured by different measuring devices, the measurement results are not the same.

When impedance in a low-frequency band is measured, the measurement error is relatively insignificant, which leads to only a small problem. However, when impedance in a high-frequency band of 1 MHz to 2 GHz is measured, the difference between measurement errors generated by different measuring devices is significant. Therefore, in order to enhance the reproducibility of a measurement value in a high-frequency band, a measured value is corrected by using an open/short correction method or an open/short/load correction method. Hereinafter, these correction methods will be described. Incidentally, measurement of impedance which is performed in the following known art and in an embodiment described later conceptually includes measurement of admittance.

In the open/short correction method, impedances of two states: a test fixture (hereinafter referred to as jig) is open/ short, are measured in order to correct the effects of stray admittance and residual impedance generated by the jig. Then, the characteristic (impedance) of an object is calculated based on the obtained impedance values.

In the open/short/load correction method, the above-described open/short measurement is performed first. Then, in a state where a load device, whose physical true value is known, is loaded on the jig, the above-described open/short measurement is performed. After that, the characteristic (impedance) of an object is calculated based on the obtained impedance values. In this method, correction can be performed more precisely than in the open/short correction method (see HP 4284A Precision LCR meter instruction manual (December 1996/33) p.6–15 to p.6–18, for example).

In the above-described known open/short correction method, one of the following two conditions must be satisfied.

First condition: impedance should be measured in an ideal open state or an ideal short state in order to obtain the effects of stray admittance and residual impedance.

Second condition: the values of impedance of the jig in open/short states are known.

However, these conditions cannot be satisfied for the following reason. That is, the ideal open/short states of the jig cannot be realized practically, and thus the first condition cannot be satisfied.

Also, stray admittance is generated when the jig is in an open state, and residual impedance is generated when the jig is in a short state. Therefore, in the above-described known art, the following instructions are given:

An operator should not move his/her hands near the jig while an open correction is performed in order to suppress variation in stray admittance.

A metallic plate having a high conductivity should be used for a short plate included in a short device used for short correction in order to suppress residual impedance to as low as possible.

However, even if these instructions are faithfully followed, it is impossible to realize true open/short states, and thus correction cannot be performed with great precision.

Of course, the open/short/load correction method has the same disadvantage as that of the open/short correction method. Furthermore, in the open/short/load correction method, a calibration value of the device used for load correction cannot be measured precisely. This will be described below.

In the open/short/load correction method, a device whose physical true value is known (hereinafter referred to as standard device) is required in order to perform load correction. According to the above-described known art, an electronic component (chip capacitor, chip coil, etc.) whose impedance is measured in advance can be used as a standard device. However, this correction method can be used only when a measured frequency is sufficiently low and measurement precision can be maintained even if the effects of stray admittance and residual impedance are ignored. Specifically, this correction method can be used when the measured frequency is 1 MHz or less.

In recent years, however, with a requirement for higher frequency of signal band, a guarantee of impedance in a high-frequency band of 1 MHz to several GHz has been required to electronic components. However, in the above-described correction methods, a correction precision required for such a guarantee of impedance in a high-frequency band cannot be obtained.

When impedance is measured in a high-frequency band of 1 MHz to several GHz, the effects of stray admittance and residual impedance cannot be ignored. Therefore, precise stray admittance and residual impedance must be obtained in order to realize sufficiently high correction precision. In order to obtain precise stray and residual characteristics, the impedance of an electronic component which is used as a standard device must be measured with great precision.

However, in order to precisely measure the impedance of the electronic component, a jig used for measuring the electronic component must be corrected, and in order to perform the correction, another standard device is required. Accordingly, it is practically impossible to realize a high-precision correction in a high-frequency band of 1 MHz to several GHz by using the open/short/load correction method, as long as an extremely precise standard device cannot be obtained.

If an object to be measured includes a coaxial connector, a standard device in which the physical true value of impedance is very precisely defined can be available. However, such a standard device can be fabricated only in an electronic component having a shape which can be attached to a coaxial connector. It is practically impossible to fabricate such a standard device in general electronic components, such as chip capacitors and chip coils.

SUMMARY OF THE INVENTION

Accordingly, it is a main object of the present invention to provide a correction method for precisely correcting a measured impedance in a high-frequency band of 1 MHz to several GHz.

In order to achieve the above-described object, the present invention provides a method of correcting a measurement error, in which the impedance of an electronic component is measured by an actual measuring device generating a measurement result different from that of a standard measuring device, and then the obtained value of impedance is corrected to the value which would be obtained from the standard measuring device. The method includes preparing in advance a correction-data obtaining sample which generates an impedance equal to an arbitrary impedance of the electronic component by a measuring operation; measuring the impedance of the correction-data obtaining sample by using the standard measuring device and the actual measuring device; obtaining an interrelated expression of the measurement result generated by the actual measuring device and the measurement result generated by the standard measuring device, the interrelated expression uniquely indicating the relationship between the true measurement value of the standard measuring device and the true measurement of the actual device; and correcting the impedance of the electronic component to the impedance which will be obtained from the standard measuring device by substituting the impedance of the electronic component measured by the actual measuring device into the interrelated expression so as to calculate the interrelated expression. Accordingly, the following effects can be obtained.

In this configuration, the interrelated expression of the actual and standard measuring devices is obtained based on the measurement result of the correction-data obtaining sample in which the impedance is not identified. Also, based on this interrelated expression, the impedance of the electronic component is corrected to the impedance which would be obtained from the standard measuring device. Accordingly, calibration using an expensive standard device is not necessary, and the actual measuring jig included in the actual measuring device need not be adjusted. Further, since the electronic characteristic is corrected by theoretical calculation, reproducibility of impedance can be enhanced regardless of the shape (coaxial/non-coaxial) of the electronic component.

The present invention provides an analytical relative correction method, which is an example of a correction method using the interrelated expression.

In the analytical relative correction method, the step of obtaining the interrelated expression includes providing a signal transmission form including a factor of measurement error of each of the standard and actual measuring devices at measurement; forming a first theoretical expression for obtaining the true measurement value of the actual measuring device in the signal transmission form and a second theoretical expression for obtaining the true measurement value of the standard measuring device in the signal transmission form; forming the interrelated expression based on the first and second theoretical expressions, the interrelated expression including an undetermined coefficient, the undetermined coefficient being determined by substituting the impedance values obtained from the standard and actual measuring devices into the interrelated expression.

The method of correcting a measurement error of the present invention can be optimally performed in a method of determining the quality of an electronic component. In the method of determining the quality of an electronic component, the impedance of an electronic component which is required to have an impedance measured by a standard measuring device is measured by an actual measuring device generating a measurement result different from that of the standard measuring device, and the quality is determined based on the measurement result.

In this determining method, the impedance of the electronic component measured by the actual measuring device is corrected by using the method of correcting a measurement error of the present invention so as to determine the quality of the electronic component by comparing the corrected impedance and the required impedance. Accordingly, the quality of the electronic component can be determined with great precision.

Also, the present invention provides a device for measuring the characteristic of an electronic component, which can perform the above-described method of correcting a measurement error.

The device includes a measuring unit for measuring the impedance of an electronic component, the measured impedance being different from that measured by a standard measuring device; a storage unit for storing the impedance of a correction-data obtaining sample measured by the standard measuring device; an interrelated-expression calculating unit for calculating an interrelated expression of the impedance of the correction-data obtaining sample measured by the measuring unit and the impedance of the correction-data obtaining sample which is measured by the standard measuring device and which is stored in the storage unit, the interrelated expression uniquely indicating the relationship between the true measurement value of the standard measuring device and the true measurement of the actual device; and a correcting unit for correcting the impedance of the electronic component to the impedance which would be obtained from the standard measuring device by substituting the impedance of the electronic component measured by the measuring unit into the interrelated expression so as to calculate the expression.

The measuring device of the present invention can be formed based on the analytical relative correction method.

The interrelated-expression calculating unit includes a unit for providing the signal transmission form including a factor of measurement error of each of the standard and actual measuring devices at measurement; a unit for forming a first theoretical expression for obtaining the true measurement value of the actual measuring device in the signal transmission form and a second theoretical expression for obtaining the true measurement value of the standard measuring device in the signal transmission form; a unit for forming the interrelated expression based on the first and second theoretical expressions, the interrelated expression including an undetermined coefficient; a unit for measuring the impedance of the correction-data obtaining sample by using the standard measuring device and the actual measuring device; and a unit for identifying the undetermined coefficient by substituting the impedance values obtained from the standard and actual measuring devices into the interrelated expression.

Other features and advantages of the present invention will become apparent from the following description of the invention which refers to the accompanying drawings.

BRIEF DESCRIPTION OF THE DRAWING(S)

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

DESCRIPTION OF THE PREFERRED EMBODIMENT(S)

Hereinafter, an embodiment of the present invention will be described with reference to the drawings. In the embodiment, the present invention is embodied in a method of correcting a measurement error, which occurs when the impedance of an electronic component, such as a surface-mount chip coil, is measured by a measuring device including an impedance analyzer.

Figure 1:
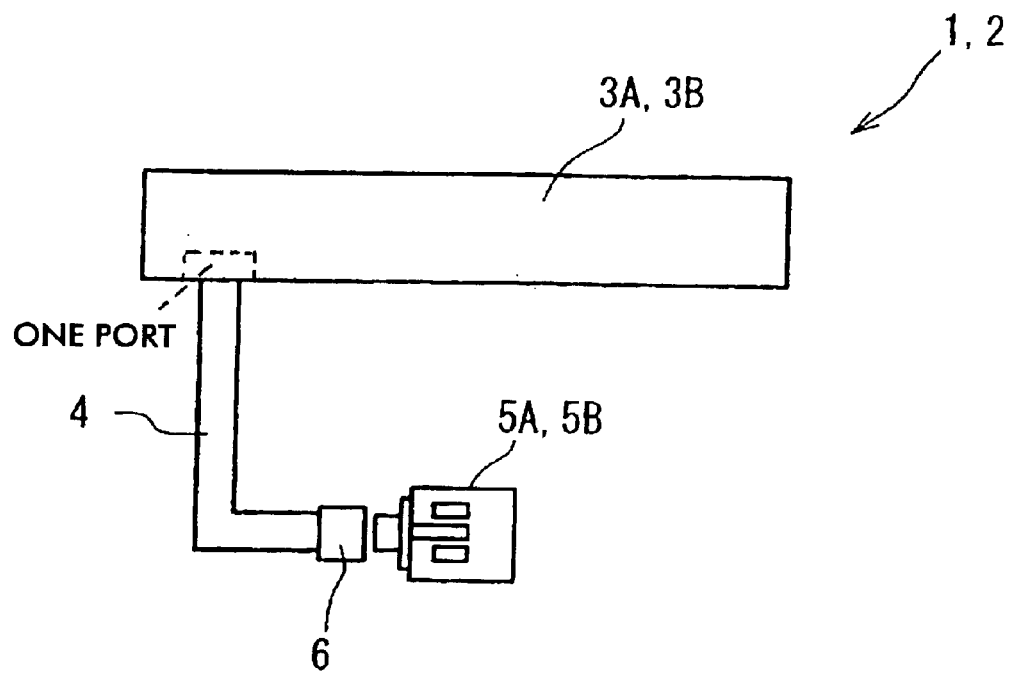
FIG. 1 is a plan view showing the configuration of a measuring device for performing a method of correcting a measurement error of the present invention.
Figure 2:
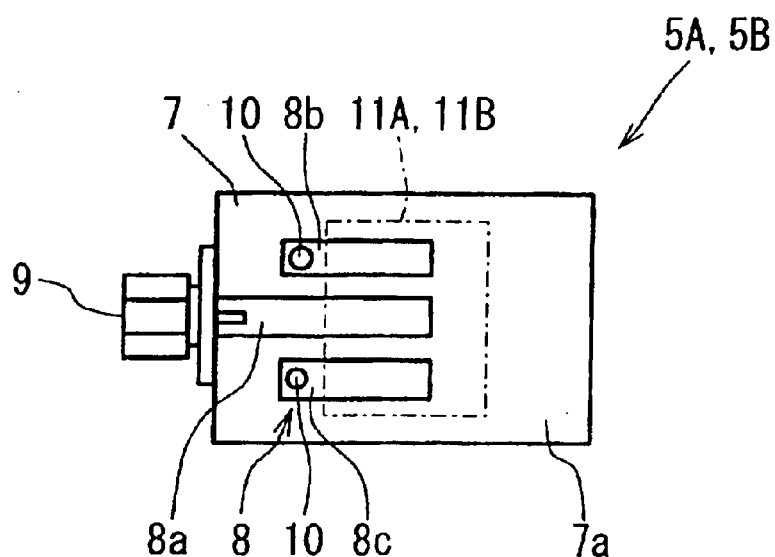
FIG. 2 is a plan view showing the configuration of a measuring jig included in the measuring device for performing the method of correcting a measurement error.
Figure 3:
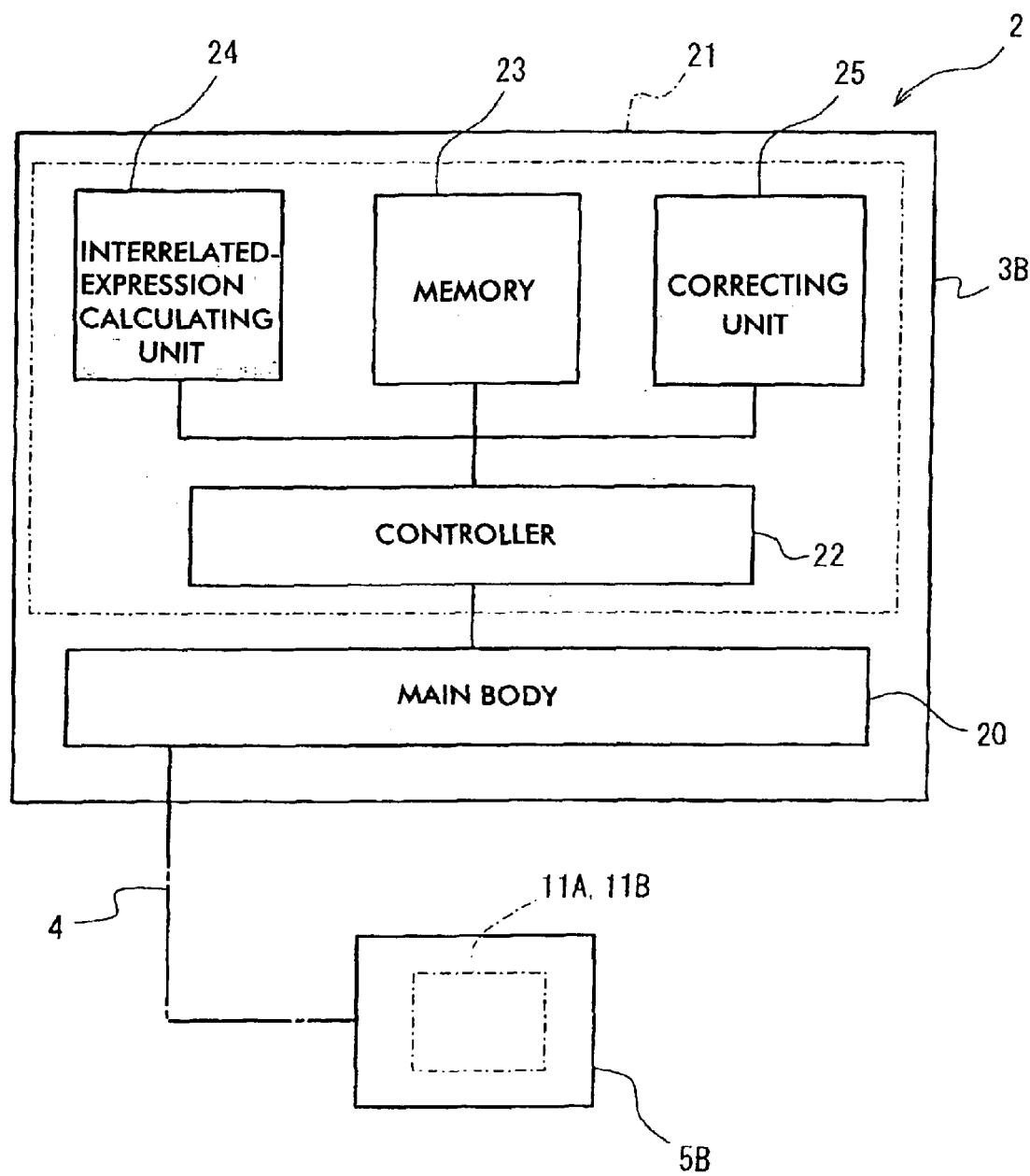
FIG. 3 is a block diagram showing the configuration of the measuring device for performing the method of correcting a measurement error.
Figure 4:
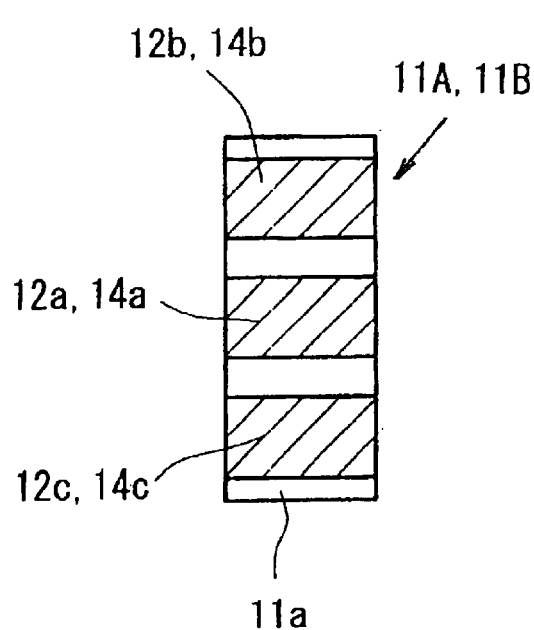
FIG. 4 is a back-side view showing the configuration of a correction-data obtaining sample and an electronic component to be measured.
Figure 5:
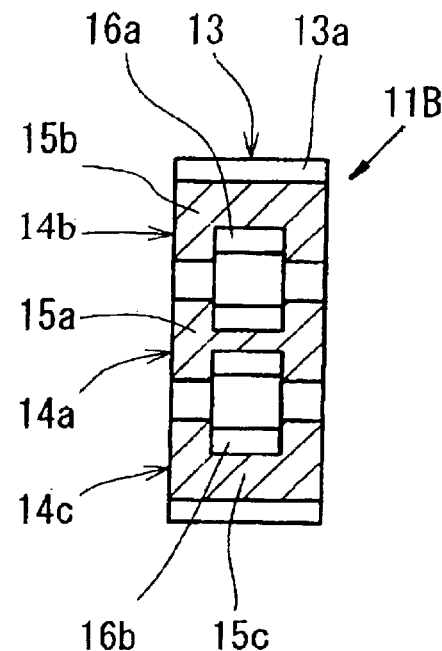
FIG. 5 is a plan view showing the configuration of the correction-data obtaining sample.

FIG. 1 is a plan view showing the configuration of a measuring device of the embodiment; FIG. 2 is a plan view showing the configuration of a measuring jig; FIG. 3 is a block diagram showing an impedance analyzer included in the measuring device; FIG. 4 is a back-side view showing the configuration of a sample to be measured (electronic component or correction-data obtaining sample); and FIG. 5 is a plan view showing the configuration of the correction-data obtaining sample.

As shown in FIG. 1, a standard measuring device 1 and an actual measuring device 2 include impedance analyzers 3A and 3B, coaxial cables 4, and measuring jigs 5A and 5B, respectively. That is, the standard measuring device 1 includes the impedance analyzer 3A and the measuring jig 5A, and the actual measuring device 2 includes the impedance analyzer 3B and the measuring jig 5B.

Each of the impedance analyzers 3A and 3B includes a 1-port input/output unit. The coaxial cable 4 is connected to this port. A coaxial-cable connector 6 is provided at the free end of the coaxial cable 4.

As shown in FIG. 2, each of the measuring jigs 5A and 5B includes an insulating substrate 7, a connection wiring unit 8, and a coaxial connector 9. The connection wiring unit 8 is provided on a surface 7a of the insulating substrate 7 and includes a signal transmission line 8a and ground lines 8b and 8c. The signal transmission line 8a is provided on the surface 7a of the insulating substrate 7 and extends from one end of the substrate 7 toward the center of the substrate 7. The ground lines 8b and 8c are provided on both sides of the signal transmission line 8a at the central portion of the surface 7a.

The signal transmission line 8a is connected to an internal conductor contact (not shown) of the coaxial connector 9 at one end of the substrate 7. The ground lines 8b and 8c are connected to a ground pattern (not shown) on the back surface of the substrate 7 via through-hole connectors 10, and are also connected to an external conductor contact (not shown) of the coaxial connector 9 via the ground pattern.

In FIG. 2, the measuring jig 5A of the standard measuring device 1 (hereinafter referred to as standard measuring jig) has the same shape as that of the measuring jig 5B of the actual measuring device 2 (hereinafter referred to as actual measuring jig). Alternatively, the shapes may be different from each other. In particular, the shape of the actual measuring jig 5B may be arranged so as to be suitable for an automatic sorting and measuring device or the like.

As shown in FIG. 3, the impedance analyzer 3B included in the actual measuring device 2 includes a main body 20 and a control unit 21. The control unit 21 includes a controller 22, a memory 23, an interrelated-expression calculating unit 24, and a correcting unit 25.

As shown in FIG. 4, a back surface 11a of each of an electronic component to be measured 11A and a correction-data obtaining sample 11B is provided with a transmission line terminal 12a and ground terminals 12b and 12c. By bringing the back surface 11a of the electronic component to be measured 11A or the correction-data obtaining sample 11B into contact with the surface 7a of the measuring jig 5, the transmission line terminal 12a and the ground terminals 12b and 12c are pressed to the signal transmission line 8a and the ground lines 8b and 8c, respectively. Accordingly, the electronic component to be measured 11A and the correction-data obtaining sample 11B are mounted on the measuring jigs 5A and 5B, so as to be measured.

In the embodiment, a sample in which an impedance equal to an arbitrary impedance of the electronic component to be measured 11A is generated by a measurement operation by the measuring devices 1 and 2 is prepared as the correction-data obtaining sample 11B. Further, in the embodiment, a plurality of (for example, three) samples $11B_{1-3}$ in which different impedances are generated by the measuring devices are used as the correction-data obtaining sample 11B. Strictly speaking, an electronic component whose impedance is equal to that of another electronic component does not exist in general. Therefore, if general electronic components are used as the samples $11B_{1-3}$, the impedances thereof are different from each other. However, the samples $11B_{1-3}$ whose impedances are different from each other can be fabricated intentionally and strictly in the following way.

As shown in FIG. 5, each of the correction-data obtaining samples $11B_{1-3}$ includes a rectangular insulator 13 having the same shape as that of the electronic component to be measured 11A. The rectangular insulator 13 is provided with a pseudo transmission line terminal 14a and pseudo ground terminals 14b and 14c, having the same configuration as that of the transmission line terminal 12a and the ground terminals 12b and 12c of the electronic component to be measured 11A. The pseudo transmission line terminal 14a and the pseudo ground terminals 14b and 14c extend from the lower surface of the rectangular insulator 13 to an upper surface 13a via the side surface. The rectangular upper ends of the pseudo transmission line terminal 14a and the pseudo ground terminals 14b and 14c form mounting terminals 15a to 15c, respectively.

Impedance adjusting elements 16a and 16b including resistor elements or the like are mounted between the adjacent mounting terminals 15a and 15b and between the adjacent mounting terminals 15a and 15c, respectively.

In each of the correction-data obtaining samples $11B_{1-3}$ on which the impedance adjusting elements 16a and 16b are mounted, by arbitrarily setting the electric characteristic (resistance in case of resistor element) of the impedance adjusting elements 16a and 16b, the impedance of each of the correction-data obtaining samples $11B_{1-3}$ can be randomly set. In the embodiment, the precise value of impedance which is to be generated by a measurement operation by the measuring device need not be set in the correction-data obtaining samples $11B_{1-3}$ in advance. Accordingly, the manufacturing cost of the correction-data obtaining samples $11B_{1-3}$ can be reduced.

Now, a method of correcting a measurement error, performed by the measuring device of the embodiment, will be described (analytical relative correction method).

First, the outline of the method will be described. When the impedance of a non-coaxial-shaped sample is measured, the measurement result differs depending on the measuring device used. Specifically, the measurement result of the correction-data obtaining sample 11B generated by the standard measuring device 1 including the standard measuring jig 5A for conducting user guarantee is disadvantageously different from the measurement result generated by the actual measuring device 2 including the actual measuring jig 5B, which is used for a preshipment inspection. Due to such an inconsistency in the measurement results, the impedance of an electronic component cannot be guaranteed to a user at the preshipment inspection.

In order to overcome such a problem, in the embodiment, the measurement result to be generated by the standard measuring device 1 is estimated based on the measurement result generated by the actual measuring device 2 by performing calculation based on a relative correction method.

Hereinafter, the theory of the correction method (analytical relative correction method) of the embodiment will be described.

Figure 6:
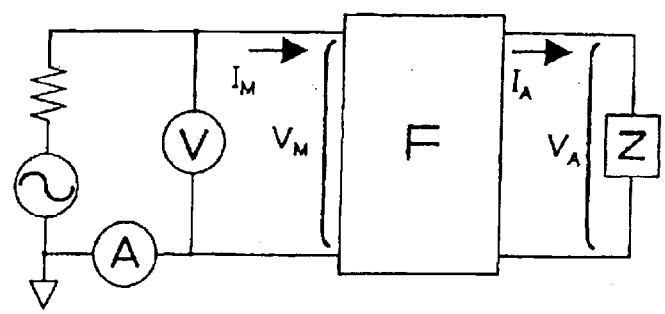
FIG. 6 is an example of a signal transmission form (error model) used for performing the method of correcting a measurement error.

First, an error factor of each of the measuring systems (the standard measuring device 1 and the actual measuring device 2) is modeled by a signal transmission form shown in FIG. 6.

In FIG. 6, F denotes the error factor of the measuring system. Z denotes the impedance of a sample to be measured (the electronic component to be measured 11A or the correction-data obtaining sample 11B). $V_M$ denotes a voltage measured by the measuring devices 1 and 2. The voltage $V_M$ is applied to the sample to be measured and the error factor F. $V_A$ denotes a voltage actually applied to the sample to be measured. $I_M$ denotes a current measured by the measuring devices 1 and 2. The current $I_M$ is applied to the sample to be measured and the error factor F. $I_A$ denotes a current actually applied to the sample to be measured.

The error factor F is generated by, for example, resistance of a measuring cable, inductance (residual impedance), and capacitance of a cable (stray admittance). When the error factor F is expressed with a so-called F-matrix, the following expression (1) is obtained.

$$\begin{pmatrix} V_M \\ I_M \end{pmatrix} = \begin{pmatrix} A & B \\ C & D \end{pmatrix} \begin{pmatrix} V_A \\ I_A \end{pmatrix} \quad (1)$$

Herein, the impedance $Z_M$ measured by the measuring devices 1 and 2 can be obtained by the following expressions (2) and (2').

$$Z_M = V_M / I_M \quad (2)$$

$$Z_A = V_A / I_A \quad (2')$$

By substituting the expressions (2) and (2') into the expression (1), the following expression (3) can be obtained.

$$Z_A = (D \cdot Z_M - B) / (C \cdot Z_M - A) \quad (3)$$

$Z_A$ in the expression (3) indicates the true impedance of the sample to be measured. The expression (3) is a rational expression, and at least one of four unknowns A, B, C, and D (hereinafter referred to as error terms A to D) constituting the error factor can be obviously selected freely. Therefore, when the error term D=1, by determining the remaining three error terms A, B, and C, the true impedance $Z_A$ of the sample to be measured can be determined based on the impedance $Z_M$ measured by the measuring devices 1 and 2.

However, if the sample to be measured has a non-coaxial shape, it is almost impossible under the present circumstances to fabricate a standard device (electronic component functioning as a standard device) whose impedance in a high-frequency band of 1 MHz to several GHz is known.

Accordingly, in the embodiment, the measurement value of the sample generated by the actual measuring device is corrected in the following way so as to precisely estimate the measurement value of the sample generated by the standard measuring device. Herein, the following assumption is made: the standard measuring device 1 in which error terms $A_1$, $B_1$, $C_1$, and $D_1$ determining the error factor $F_1$ of measurement are identified is prepared, and the impedance $Z_{M1}$ of the correction-data obtaining sample 11B is measured by this standard measuring device 1.

In this case, the true impedance $Z_A$ of the correction-data obtaining sample 11B can be obtained by the following theoretical expression (4) based on the impedance $Z_{M1}$ measured by the standard measuring device 1.

$$Z_A = (D_1 \cdot Z_{M1} - B_1) / (C_1 \cdot Z_{M1} - A_1) \quad (4)$$

Likewise, the following assumption is made: the actual measuring device 2 in which error terms $A_2$, $B_2$, $C_2$, and $D_2$ determining the error factor $F_2$ of measurement are identified is prepared, and the impedance $Z_{M2}$ of the correction-data obtaining sample 11B is measured by this actual measuring device 2.

In this case, the true impedance $Z_A$ of the correction-data obtaining sample 11B can be obtained by the following theoretical expression (5) based on the impedance $Z_{M2}$ measured by the actual measuring device 2.

$$Z_A = (D_2 \cdot Z_{M2} - B_2)/(C_2 \cdot Z_{M2} - A_2) \quad (5)$$

Herein, the value of the true impedance $Z_A$ of the correction-data obtaining sample 11B is equal in the above two cases although different measuring systems are used. Therefore, the right side of the theoretical expression (4) is equal to that of the theoretical expression (5). Accordingly, the following expression (6) can be obtained.

$$(D_1 \cdot Z_{M1} - B_1)/(C_1 \cdot Z_{M1} - A_1) = (D_2 \cdot Z_{M2} - B_2)/(C_2 \cdot Z_{M2} - A_2) \quad (6)$$

Further, by transforming the expression (6), the following expression (7) can be obtained.

$$Z_{M1} = [(A_1 \cdot D_2 - B_1 \cdot C_2) Z_{M2} - B_2 \cdot A_1 + A_2 \cdot B_1]/[(C_2 \cdot D_1 - C_1 \cdot D_2) Z_{M2} - A_2 \cdot D_1 + B_2 \cdot C_1] \quad (7)$$

In the above expression (7), by dividing the numerator and the denominator in the right side by $(A_1 \cdot D_2 - B_1 \cdot C_2)$ and performing an adequate variable transform, the following expression (8) including three undetermined coefficients can be obtained. The expression (8) is the relative correction expression used for impedance measurement in the present invention.

$$Z_{M1} = (Z_{M2} + \alpha)/(\beta \cdot Z_{M2} + \gamma) \quad (8)$$

If the undetermined coefficients α, β, and γ in the interrelated expression (8) can be identified, the measurement result $Z_{M1}$ to be generated by the standard measuring device 1 can be precisely estimated based on the measurement result $Z_{M2}$ generated by the actual measuring device 2.

If the standard measuring device 1 is a perfect measuring device free from the error factor F, a relative correction between this ideal standard measuring device 1 and the actual measuring device 2 is performed. Such a relative correction must be consistent with the expression (7), which is an error removing expression of a 1-port measuring system.

Actually, if the standard measuring device 1 is regarded as a perfect device free from the error factor F, the coefficient $A_1 = 1$, $B_1 = 0$, $C_1 = 0$, and $D_1 = 1$ in the interrelated expression (8). In this case, the measured impedance $Z_{M1}$ which can be obtained from the interrelated expression (8) is equal to the measured impedance $Z_{M1}$ which can be obtained from the expression (7).

The interrelated expression (8) includes the three undetermined coefficients α, β, and γ, and the two variables $Z_{M1}$ and $Z_{M2}$ are values obtained by measurement. Therefore, by preparing three samples as the correction-data obtaining sample 11B and then by measuring the impedance of each of the three samples by using the standard measuring device 1 and the actual measuring device 2, the undetermined coefficients α, β, and γ can be identified. That is, by using this error correction method, the undetermined coefficients α, β, and γ can be identified even if the true impedance of the correction-data obtaining sample 11B and the error terms $A_1$, $B_1$, $C_1$, $D_1$, $A_2$, $B_2$, $C_2$, and $D_2$ of the measuring devices 1 and 2 are unknown.

By substituting the measured impedance of each of the three correction-data obtaining samples 11B into the interrelated expression (8) and transforming it, the following interrelated expression (9) can be obtained.

$$\begin{pmatrix} 1 & -Z_{M1(1)} \cdot Z_{M2(1)} & -Z_{M1(1)} \\ 1 & -Z_{M1(2)} \cdot Z_{M2(2)} & -Z_{M1(2)} \\ 1 & -Z_{M1(3)} \cdot Z_{M2(3)} & -Z_{M1(3)} \end{pmatrix} \begin{pmatrix} \alpha \\ \beta \\ \gamma \end{pmatrix} = \begin{pmatrix} -Z_{M2(1)} \\ -Z_{M2(2)} \\ -Z_{M2(3)} \end{pmatrix} \quad (9)$$

The interrelated expressions (8) and (9) of the present invention are relational expressions which uniquely indicate the relationship between the true measurement value generated by the standard measuring device 1 and the true measurement value generated by the actual measuring device 2. Herein, uniquely means that the both true values match substantially precisely. Substantially precisely means the correction precision in which the correction error is in the range of ±0.8%, as will be described later with reference to FIG. 9.

In $Z_{M2(1)}$, $Z_{M2(2)}$, $Z_{M1(1)}$, and so on in the interrelated expression (9), each of the numbers $(1)$, $(2)$, and $(3)$ added to the end of numerical subscripts $_{M1}$ and $_{M2}$ indicates the number of the respective correction-data obtaining samples $11B_{1-3}$. For example, $Z_{M2(1)}$ means the measured impedance $Z_{M2}$ of the sample $11B_1$.

In the above-described correction method, the undetermined coefficients α, β, and γ are obtained by solving ternary linear simultaneous equations using the measured impedance values $Z_{M2(1)-M2(3)}$ of the three correction-data obtaining samples $11B_{1-3}$. However, the undetermined coefficients α, β, and γ may be identified by obtaining the measured impedance values $Z_{M2(1)-M2(n)}$ of four or more correction-data obtaining samples $11B_{1-n}$ and by using a maximum likelihood method such as a minimum square method. Accordingly, the effect of a measurement error occurred when the correction-data obtaining sample 11B is measured can be reduced.

Further, although the interrelated expression (9) is a cubic determinant, which has a mathematically very simple construction, it is bothersome for an operator to perform a manual calculation so as to obtain the solutions. In order to solve this problem, the calculation can be automated by calculating the interrelated expression (9) by using an algorithm which is generally used in an automatic calculation with a computer, such as LU decomposition.

Figure 7:
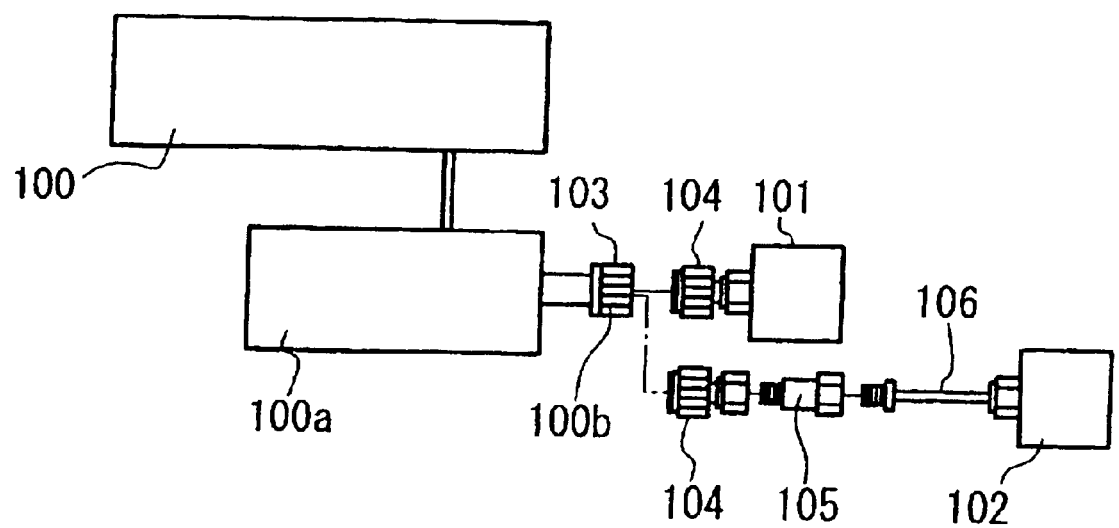
FIG. 7 shows the configuration of a system for performing a method of correcting impedance of the present invention.

Next, the result generated by performing the impedance correction method of the present invention will be described. FIG. 7 shows the configuration of a system which has performed the correction. In this system, the standard measuring device 1 and the actual measuring device 2 include an impedance analyzer 100 and a standard measuring jig 101 and an actual measuring jig 102.

The impedance analyzer 100 includes a 4291A made by Agilent Technologies. The impedance analyzer 100 includes a test head 100a. The test head 100a includes a calibration surface 100b, and an APC7 (connector having a diameter of 7 mm) to SMA (connector having a diameter of 3.5 mm) converting adapter 103 is attached to the calibration surface 100b. Each of the standard measuring jig 101 and the actual measuring jig 102 includes an SMA connector 104. By loading the connector 104 onto the adapter 103, the jigs 101 and 102 can be attached to the calibration surface 100b of the test head 100a.

However, the actual measuring jig 102 is attached to the adapter 103 via an attenuator 105 of 3 dB (made by MKT TAISEI Co., LTD.) and a semi-flexible coaxial cable 106 of 1.5 m (made by FLEXCO). By providing the attenuator 105 and the coaxial cable 106, an error which is more significant than the normal error is given to the impedance of the electronic component to be measured 11A, which is mounted on the actual measuring jig 102. Accordingly, a great precision of the correcting method of the present invention can be clearly understood.

In the above-described configuration, the APC7 to SMA converting adapter 103 forms the coaxial cable connector 6 shown in FIG. 1, the SMA connector 104 forms the coaxial connector 9 shown in FIG. 2, the standard measuring jig 101 forms the standard measuring jig 5A, and the actual measuring jig 102 forms the actual measuring jig 5B.

In the above-described system, by loading the standard measuring jig 101 onto the impedance analyzer 100, the standard measuring device 1 can be formed. Also, by loading the actual measuring jig 102 onto the impedance analyzer 100, the actual measuring device 2 can be formed.

In the above-described system, the correction-data obtaining samples $11B_{1-3}$ of open, short, and terminal are loaded on the standard measuring jig 101 and the actual measuring jig 102. Then, the jigs 101 and 102 are connected to the test head 100*a* so as to measure the impedance of each sample. Further, the measured impedance values are substituted into the interrelated expression (9) so as to identify the undetermined coefficients α, β, and γ. The measurement of impedance is performed in a frequency range of 1 MHz to 100 MHz and with 201 points.

Next, electronic components to be measured $11A_{1-4}$, including a capacitor, an inductor, a 100 Ω-resistor, and a 330 Ω-resistor, are loaded on the actual measuring jig 102. Then, the actual measuring jig 102 is connected to the test head 100*a* so as to measure the impedance of the electronic components $11A_{1-4}$ by using the impedance analyzer 100.

The obtained impedance values $Z_{M2(1)-M2(4)}$ (corresponding to the measured values generated by the actual measuring device 2) are substituted into the interrelated expressions (8) and (9), in which the undetermined coefficients α, β, and γ are identified in advance, so that the measurement values $Z_{M1(1)-M1(4)}$ to be generated by the standard measuring device 1 are estimated.

Next, the electronic components $11A_{1-4}$ are loaded on the standard measuring jig 101. Then, the standard measuring jig 101 is connected to the test head 100*a* so as to measure the impedance of each of the electronic components $11A_{1-4}$ by using the impedance analyzer 100. Then, the measured impedance values of the electronic components $11A_{1-4}$ (corresponding to the true measurement values $Z_{A1-4}$ generated by the standard measuring device 1) are compared with the estimated values $Z_{M1(1)-M1(4)}$ of the standard measuring device 1. The comparison result is shown in FIGS. 8 and 9.

Figure 8:
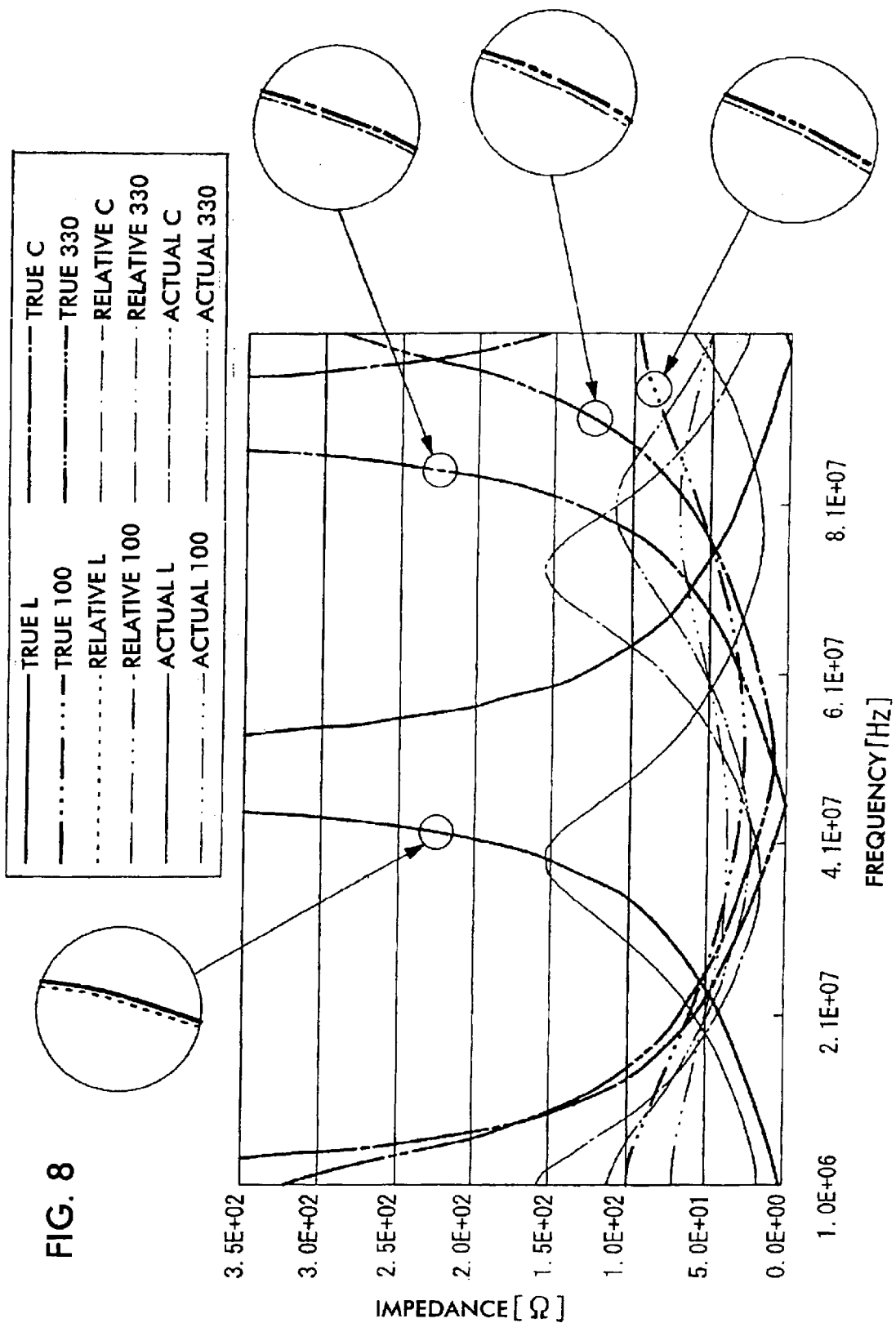
FIG. 8 is a diagram showing correction data and a measurement result obtained by performing the method of correcting a measurement error.
Figure 9:
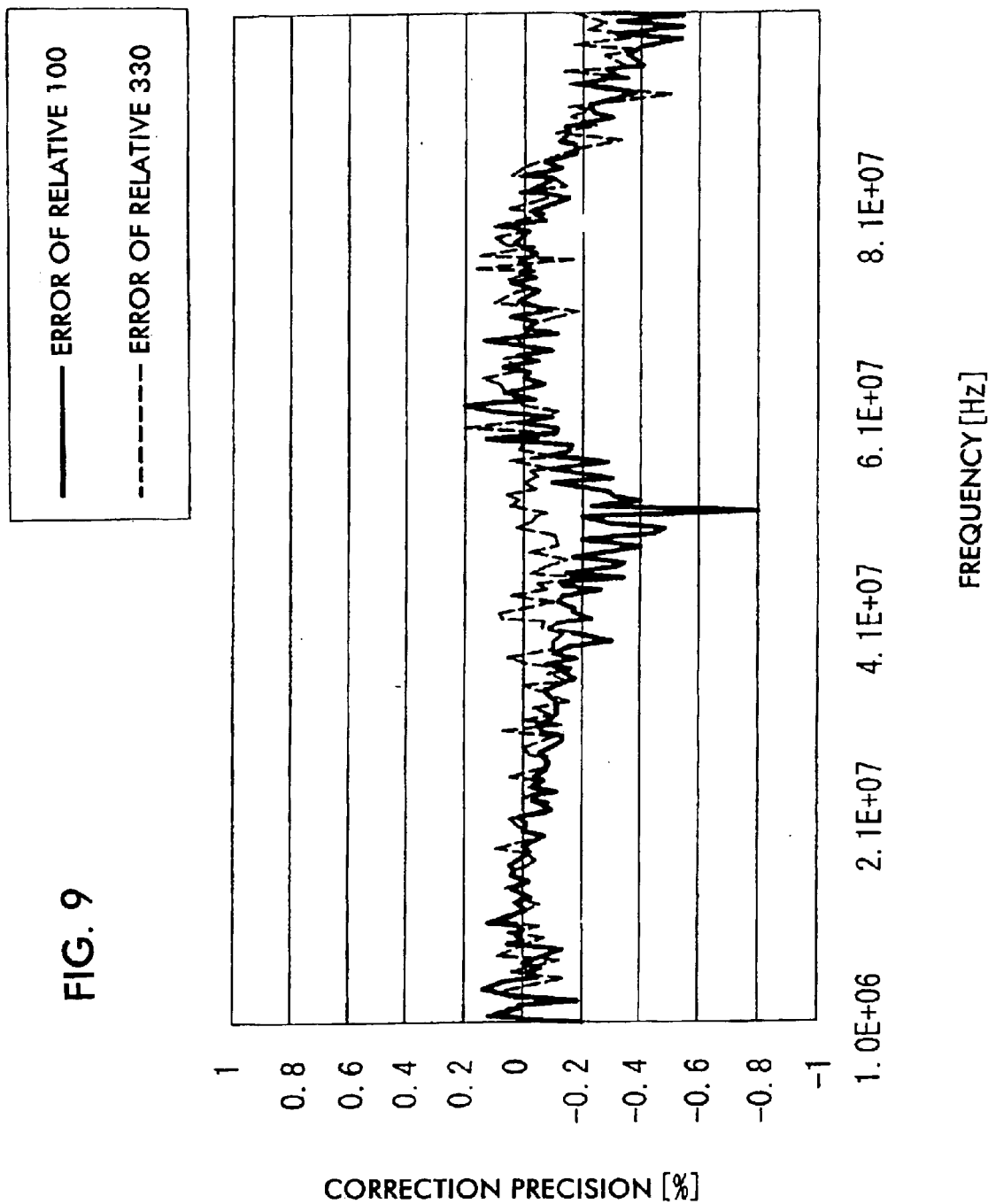
FIG. 9 is a diagram showing the correction precision of the correction data obtained by performing the method of correcting a measurement error.

FIG. 8 shows the measurement result and FIG. 9 shows the variation in the error of the measured values of the 100 Ω-resistor and the 330 Ω-resistor. In FIG. 8, the horizontal axis indicates the frequency and the vertical axis indicates the impedance. In FIG. 9, the horizontal axis indicates the frequency and the vertical axis indicates the correction precision.

In these figures, true L, true C, true 100, and true 330 indicate the measurement results of the inductor, capacitor, 100 Ω-resistor, and 330 Ω-resistor, the results being generated by the standard measuring device 1 (standard measuring jig 101). Also, actual L, actual C, actual 100, and actual 330 indicate the measurement results of the inductor, capacitor, 100 Ω-resistor, and 330 Ω-resistor, the results being generated by the actual measuring device 2 (actual measuring jig 102). Further, relative L, relative C, relative 100, and relative 330 indicate the correction values in the inductor, capacitor, 100 Ω-resistor, and 330 Ω-resistor, the values being generated by the actual measuring device 2 (actual measuring jig 102).

As is clear from these figures, the measurement error is precisely corrected so that the correction precision is within the range of ±0.8% by performing the correction method of the present invention.

Hereinafter, the method of correcting a measurement error of the embodiment will be described in detail.

First, three correction-data obtaining samples $11B_{1-3}$ are loaded on the standard measuring device 1. Then, the impedance of each of the samples $11B_{1-3}$ is measured at each frequency point. The impedance of each of the samples $11B_{1-3}$ measured by the standard measuring device 1 is input to the actual measuring device 2 through a data input unit (not shown) thereof in advance. The input measurement result generated by the standard measuring device 1 is stored in the memory 23 through the controller 22.

Likewise, the three correction-data obtaining samples $11B_{1-3}$ are loaded on the actual measuring device 2. Then, the impedance of each of the samples $11B_{1-3}$ is measured at each frequency point.

The impedance of each of the samples $11B_{1-3}$ measured by the actual measuring device 2 is input to the interrelated-expression calculating unit 24 through the controller 22.

When the impedance of each of the samples $11B_{1-3}$ measured by the actual measuring device 2 is input to the interrelated-expression calculating unit 24, the interrelated-expression calculating unit 24 reads the measurement result of the correction-data obtaining samples $11B_{1-3}$, the result being generated by the standard measuring device 1, from the memory 23 through the controller 22.

The interrelated-expression calculating unit 24 calculates an interrelated expression of the measurement result generated by the actual measuring device 2 and the measurement result generated by the standard measuring device 1 based on the measurement results generated by the standard measuring device 1 and the actual measuring device 2. The calculation is performed based on the above-described interrelated expressions (8) and (9).

After this preparation process, the impedance of the electronic component 11A is measured by the main body 20 of the impedance analyzer of the actual measuring device 2. The measurement result is input to the correcting unit 25 through the controller 22.

When the measurement result of the electronic component 11A is input to the correcting unit 25, the correcting unit 25 reads the interrelated expression from the memory 23 through the controller 22. Then, the correcting unit 25 substitutes the measured impedance of the electronic component 11A into the read interrelated expression so as to calculate the expression. Accordingly, the correcting unit 25 corrects the impedance of the electronic component 11A measured by the actual measuring device 2 to the impedance which will be obtained from the standard measuring device 1. Then, the correcting unit 25 externally outputs the corrected impedance through the controller 22. The output impedance may be displayed by a display unit (not shown) or may be output as data from a data output unit (not shown).

This computing processing may be executed by the control unit 21 included in the impedance analyzer 3B, as described above. Alternatively, an external computer may be connected to the impedance analyzer 3 so that the measurement result is output to the external computer, which executes the computing processing.

According to the above-described method of correcting a measurement result of the embodiment, the following advantages can be obtained. When a manufacturer of electronic components guarantees the impedance of an electronic component, the guarantee is based on the measurement result generated by a measuring device of the manufacturer. However, if the impedance of the electronic component is measured by a measuring device of a user who has purchased the electronic component, the measurement result may be different from that of the manufacturer side. In this case, the impedance guaranteed by the manufacturer is uncertain and cannot be reproduced.

On the other hand, when the method of correcting a measurement error of the embodiment is performed by regarding the manufacturer's measuring device as the standard measuring device 1 and by regarding the user's measuring device as the actual measuring device 2, the impedance which is estimated to be equal to the measurement result in the manufacturer's side can be calculated in the user's side based on the impedance measured by the user's actual measuring device 2. Accordingly, the impedance of the electronic component guaranteed by the manufacturer can be reproduced more reliably, and thus the user can accept the electronic component.

Furthermore, the correction can be performed without strictly testing and managing the state of the actual measuring device 2 (for example, without performing control and management so that the actual measuring jig 5B of the actual measuring device 2 has the same characteristic as that of the standard measuring jig 5A of the standard measuring device 1). Accordingly, the cost required for measurement can be suppressed.

Also, the manufacturer can use one of many automatic measuring and sorting devices, which are used in a mass producing process, as the actual measuring device. Accordingly, the cost required for measurement can be suppressed (in this case, cost for sorting out defective components). In addition, the measurement time can be shortened.

Furthermore, the measurement error caused by the measuring jigs 5A and 5B and the measurement error of the entire actual measuring device 2 can be simultaneously corrected. Therefore, a special calibration need not be performed in the actual measuring device 2, and the cost for measurement can be suppressed accordingly.

Furthermore, in the measuring device of the embodiment, even if the actual measuring jig 5B, in which a function of incorporating into an automatic measuring and sorting device and long-life have higher priority than a stable measurement characteristic, is used, the measurement result is not affected in any way. Therefore, the cost required for measurement can be suppressed and the measurement time can be shortened.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of correcting a measurement error, in which the impedance of an electronic component is measured by an actual measuring device generating a measurement result different from that of a standard measuring device, and then the obtained value of impedance is corrected to the value which would be obtained from the standard measuring device, the method comprising:

preparing a correction-data obtaining sample which generates an impedance equal to an arbitrary impedance of the electronic component by a measuring operation;

measuring the impedance of the correction-data obtaining sample by using the standard measuring device and the actual measuring device;

obtaining an interrelated expression of the measurement result generated by the actual measuring device and the measurement result generated by the standard measuring device, the interrelated expression uniquely indicating the relationship between the true measurement value of the standard measuring device and the true measurement value of the actual measuring device; and correcting the impedance of the electronic component to the impedance which would be obtained from the standard measuring device by substituting the impedance of the electronic component measured by the actual measuring device into the interrelated expression so as to calculate the interrelated expression.

2. The method according to claim 1, wherein the step of obtaining the interrelated expression comprises:

providing a signal transmission form including a factor of measurement error of each of the standard and actual measuring devices at measurement;

forming a first theoretical expression for obtaining the true measurement value of the actual measuring device in the signal transmission form and a second theoretical expression for obtaining the true measurement value of the standard measuring device in the signal transmission form; and forming the interrelated expression based on the first and second theoretical expressions, the interrelated expression including an undetermined coefficient, the undetermined coefficient being determined by substituting the impedance values of the correction data obtaining device obtained from the standard and actual measuring devices into the interrelated expression.

3. A method of determining the quality of an electronic component, in which an electronic component required to have an impedance measured by a standard measuring device is measured by an actual measuring device generating a measurement result different from that of the standard measuring device, and the quality is determined based on the measurement result, the method comprising:

correcting the impedance of the electronic component measured by the actual measuring device by using the method of correcting a measurement error according to claim 1 so as to determine the quality of the electronic component by comparing the corrected impedance and the required impedance.

4. A device for measuring the characteristic of an electronic component, the device comprising:

measuring means for measuring the impedance of an electronic component, the measured impedance being different from that measured by a standard measuring device;

storage means for storing the impedance of a correction-data obtaining sample measured by the standard measuring device;

interrelated-expression calculating means for calculating an interrelated expression of the impedance of the correction-data obtaining sample measured by the measuring means and the impedance of the correction-data obtaining sample which is measured by the standard measuring device and which is stored in the storage means, the interrelated-expression uniquely indicating the relationship between the true measurement value of the standard measuring device and the true measurement value of the actual measuring device; and correcting means for correcting the impedance of the electronic component to the impedance which would be obtained from the standard measuring device by substituting the impedance of the electronic component measured by the measuring means into the interrelated expression so as to calculate the expression.

5. The device according to claim 4, wherein the interrelated-expression calculating means comprises:

means for providing the signal transmission form including a factor of measurement error of each of the standard and actual measuring devices at measurement;

means for forming a first theoretical expression for obtaining the true measurement value of the actual measuring device in the signal transmission form and a second theoretical expression for obtaining the true measurement value of the standard measuring device in the signal transmission form;

means for forming the interrelated expression based on the first and second theoretical expressions, the interrelated expression including an undetermined coefficient; and means for identifying the undetermined coefficient by substituting the impedance values obtained from the standard and actual measuring devices into the interrelated expression.

6. A device for measuring the characteristic of an electronic component, the device comprising:

a measuring unit for measuring the impedance of an electronic component, the measured impedance being different from that measured by a standard measuring device;

a storage unit for storing the impedance of a correction-data obtaining sample measured by the standard measuring device;

a interrelated-expression calculating unit for calculating an interrelated expression of the impedance of the correction-data obtaining sample measured by the measuring unit and the impedance of the correction-data obtaining sample which is measured by the standard measuring device and which is stored in the storage unit, the interrelated-expression uniquely indicating the relationship between the true measurement value of the standard measuring device and the true measurement value of the actual measuring device; and a correcting unit for correcting the impedance of the electronic component to the impedance which would be obtained from the standard measuring device by substituting the impedance of the electronic component measured by the measuring unit into the interrelated expression so as to calculate the expression.

7. The device according to claim 6, wherein the interrelated-expression calculating unit comprises:

a unit for providing the signal transmission form including a factor of measurement error of each of the standard and actual measuring devices at measurement;

a unit for forming a first theoretical expression for obtaining the true measurement value of the actual measuring device in the signal transmission form and a second theoretical expression for obtaining the true measurement value of the standard measuring device in the signal transmission form;

a unit for forming the interrelated expression based on the first and second theoretical expressions, the interrelated expression including an undetermined coefficient; and a unit for identifying the undetermined coefficient by substituting the impedance values obtained from the standard and actual measuring devices into the interrelated expression.

* * * * *